United States Patent [19]

Bouffard et al.

[11] Patent Number: 5,409,743

[45] Date of Patent: Apr. 25, 1995

[54] PECVD PROCESS FOR FORMING BPSG WITH LOW FLOW TEMPERATURE

[75] Inventors: Mark D. Bouffard, Westford; William J. King, Jericho; Cheryl M. Martin, Essex Junction, all of Vt.

[73] Assignee: International Business Machines Corporation, Armonk, N.Y.

[21] Appl. No.: 62,658

[22] Filed: May 14, 1993

[51] Int. Cl.⁶ .................. B05D 3/06; C23C 16/00; H01L 21/02; C03C 15/00

[52] U.S. Cl. .................. 427/579; 427/255.3; 427/376.2; 437/240; 156/643

[58] Field of Search .......... 427/563, 574, 578, 579, 427/559, 376.2, 526, 527, 530, 255.3; 437/238, 240; 156/643

[56] References Cited

U.S. PATENT DOCUMENTS

| | | | |
|---|---|---|---|
| 4,420,503 | 12/1983 | Leung et al. | 427/376.2 |
| 4,546,016 | 10/1985 | Kern | 427/255.3 |
| 4,708,884 | 11/1987 | Chandross et al. | 427/255.3 |
| 4,791,005 | 12/1988 | Becker et al. | 427/255.3 |
| 4,892,753 | 1/1990 | Wang et al. | 427/579 |
| 5,104,482 | 4/1992 | Monkowski et al. | 427/255.3 |
| 5,124,278 | 6/1992 | Bohling et al. | 427/255.1 |
| 5,180,692 | 1/1993 | Ibuka et al. | 437/240 |
| 5,262,356 | 11/1993 | Fujii | 427/255.3 |

OTHER PUBLICATIONS

Proceedings of the Sira International Seminar on Thin Film Preparation and Processing Technology, Brighton, UK, 26–28 Mar. 1985, ISSN, 0042-207X, Vacuum, Oct.–Nov. 1985, pp. 441–443, A. C. Sharp et al.

Solid State Technology, Jan. 1984, USA, vol. 27, NR. 1, pp. 161–170, ISSN 0038-111X, J. E. Tong et al.

Solid State Technology, Jun. 1985, USA, vol. 28, NR. 6, pp. 171–179, ISSN 0038-111X, W. Kern et al.

Primary Examiner—Marianne Padgett
Attorney, Agent, or Firm—William D. Sabo; James M. Leas

[57] ABSTRACT

A method of forming a BPSG film in a PECVD reactor with ratios of $P_2O_3/P_2O_5$ such that the film flows at low temperature in a non-oxidizing ambient and produces a reduced number of particulates. The method permits tailoring of the wall angle of a BPSG film by controlling the $P_2O_3/P_2O_5$ ratio.

19 Claims, 6 Drawing Sheets

| Trial # | $N_2O$ Flow (lpm) | $SiH_4$ Flow (ccpm) | Pressure (torr) | Boron Wt (%) | Phos Wt (%) | BPSG Thickness (nm) | BPSG Range (nm) | $P_2O_3/P_2O_5$ (%) |
|---|---|---|---|---|---|---|---|---|
| 8 | 10.00 | 200.0 | 2.60 | 5.72 | 3.56 | 419.7 | 19.8 | 4.2 |
| 5 | 6.00 | 160.0 | 2.60 | 6.24 | 4.16 | 424.7 | 18.6 | 6.7 |
| 2 | 10.00 | 160.0 | 2.20 | 5.04 | 4.87 | 434.2 | 31.7 | 9.2 |
| 6 | 10.00 | 160.0 | 2.60 | 6.26 | 4.16 | 403.0 | 20.2 | 3.5 |
| 7 | 6.00 | 200.0 | 2.60 | 5.12 | 3.92 | 508.1 | 18.4 | 16.0 |
| 1 | 6.00 | 160.0 | 2.20 | 5.26 | 5.03 | 459.9 | 25.0 | 23.0 |
| 3 | 6.00 | 200.0 | 2.20 | 4.46 | 4.52 | 529.2 | 30.4 | 34.1 |
| 4 | 10.00 | 200.0 | 2.20 | 4.25 | 4.55 | 505.7 | 32.8 | 27.4 |
| APCVD | ---- | ---- | --- | 4.16 | 4.44 | ---- | --- | 5.7 |
| APCVD | ---- | ---- | --- | 4.17 | 4.24 | ---- | --- | 4.0 |

| Trial # | N₂O Flow (lpm) | SiH₄ Flow (ccpm) | Pressure (torr) | Boron Wt (%) | Phos Wt (%) | BPSG Thickness (nm) | BPSG Range (nm) | $P_2O_3/P_2O_5$ (%) |
|---|---|---|---|---|---|---|---|---|
| 8 | 10.00 | 200.0 | 2.60 | 5.72 | 3.56 | 419.7 | 19.8 | 4.2 |
| 5 | 6.00 | 160.0 | 2.60 | 6.24 | 4.16 | 424.7 | 18.6 | 6.7 |
| 2 | 10.00 | 160.0 | 2.20 | 5.04 | 4.87 | 434.2 | 31.7 | 9.2 |
| 6 | 10.00 | 160.0 | 2.60 | 6.26 | 4.16 | 403.0 | 20.2 | 3.5 |
| 7 | 6.00 | 200.0 | 2.60 | 5.12 | 3.92 | 508.1 | 18.4 | 16.0 |
| 1 | 6.00 | 160.0 | 2.20 | 5.26 | 5.03 | 459.9 | 25.0 | 23.0 |
| 3 | 6.00 | 200.0 | 2.20 | 4.46 | 4.52 | 529.2 | 30.4 | 34.1 |
| 4 | 10.00 | 200.0 | 2.20 | 4.25 | 4.55 | 505.7 | 32.8 | 27.4 |
| APCVD | --- | --- | --- | 4.16 | 4.44 | --- | --- | 5.7 |
| APCVD | --- | --- | --- | 4.17 | 4.24 | --- | --- | 4.0 |

FIG. 2

PECVD PROCESS FOR FORMING BPSG WITH LOW FLOW TEMPERATURE

FIELD OF THE INVENTION

This invention generally relates to smoothing contours on the surface of an integrated circuit chip by flowing a borophosphosilicate glass (BPSG). More particularly, it relates to a composition of the BPSG and methods for its deposition and anneal that provide desired step coverage, wall angle, and film stability. Even more particularly, it relates to a plasma enhanced chemical vapor deposition (PECVD) process for BPSG deposition that provides a BPSG composition that can later be flowed at low temperature in a non-oxidizing environment.

BACKGROUND OF THE INVENTION

BPSG films are widely used in the semiconductor industry, offering an insulating material with two key advantages: (1) BPSG can be flowed at a lower temperature than other materials to smooth steps and fill trenches, providing a gradually tapered contour that permits deposition of a uniform thickness of metal; and (2) the phosphorous in BPSG is capable of mobile ion gettering.

The ability to process at low temperature is increasingly important for the fabrication of integrated circuits with devices having short channel lengths and shallow junctions. By taking advantage of the ability to flow the glass at low temperature, a smoother surface is achieved without redistribution of dopants in these underlying integrated circuit devices. A surface free of sharply changing topology permits metal layers to be deposited with more uniform metal thickness and provides a more reliable insulation between conductive layers. Without a material that flows, it was found that the insulator and the conductor are much thinner adjacent steps, and these are the regions that are later found to produce either opens in the metal lines or short circuits between levels of metal. A BPSG anneal step that flows the glass eliminates the thinning problems and increases chip reliability.

Chemical vapor deposition (CVD) has long been used to deposit BPSG on integrated circuits. Three processes are available, atmospheric pressure chemical vapor deposition (APCVD), low pressure chemical vapor deposition (LPCVD), and plasma enhanced chemical vapor deposition (PECVD).

In the APCVD process used in manufacturing, wafers move on a belt through a furnace at elevated temperature under injectors that provide separate flows of reactant gases that mix and react on the wafer surface. Reactant gases typically emanate from different parts of the injector and reactants are held apart from each other for a short distance in the furnace by nitrogen blankets so that reactants mix and react only when they reach the wafer surface. Gases such as silane, oxygen, diborane, and phosphene are used as reactants. The process provides BPSG films that flow at low temperature. In particular, the BPSG films formed by APCVD flow at temperatures below 1000° C. in a non-oxidizing environment.

However, the APCVD process poses significant manufacturing difficulties, including: (1) a high level of particulates on each wafer; (2) film thickness and film compositional variation within a wafer and between wafers; (3) the requirement for frequent injector replacement for cleaning, and the additional substantial tool down-time for requisite performance tests after injector replacement; and (4) the inability to quickly switch from BPSG deposition to another material deposition without changing injectors.

A process providing fewer defects, improved thickness and compositional uniformity, self cleaning of reactor parts, and the ability to switch the materials being deposited without changing reactor parts would therefore provide significant advantages to a manufacturer.

A process for depositing BPSG using PECVD has posed significant difficulties as reported by Tong et. al. in "Solid State Technology," January, 1984, p. 161-170 and by Kern and Smeltzer in "Solid State Technology," June, 1985, p. 171-179. One of the difficulties noted was that the PECVD film needed a 70° higher anneal temperature to achieve the same wall angle when the anneal was conducted in a dry nitrogen environment than when it was conducted in a steam environment. The article also points out that annealing in a steam environment can cause problems for exposed contact openings, namely the growth of oxide in the contacts.

Thus, a method is needed to provide BPSG that retains the flow properties of the APCVD process without the disadvantages.

SUMMARY OF THE INVENTION

It is therefore an object of the present invention to provide a PECVD method of forming BPSG films that flow at low temperature in a non-oxidizing environment while providing high resistance to defects.

It is another object of this invention to provide a composition of BPSG formed by PECVD that flows at low temperature in a non-oxidizing environment while providing high resistance to defects.

It is another object of this invention to provide a method of forming contacts with sloping sidewalls using the variable flow characteristics found to be available from the use of PECVD BPSG.

These and other objects of the invention are accomplished by the method more fully described below for forming a BPSG film. According to the invention, it has been found that the higher anneal temperature required of BPSG films formed by means of PECVD is caused by a high proportion of $P_2O_3$ as compared to more fully oxidized $P_2O_5$ in the films; however, a small proportion of $P_2O_3$ is needed in the BPSG film because a purely $P_2O_5$ composition is unstable and produces large quantities of crystalline particulates. Means are provided in the 1.5 invention to achieve a desired proportion of $P_2O_3$ in the film as compared to $P_2O_5$ by adjusting parameters, including silane flow rate, nitrous oxide flow rate, and overall gas pressure during the PECVD deposition.

In addition, means are provided in a second embodiment of the invention to take advantage of the fact that a film with a high $P_2O_3$ composition does not flow during a non-oxidizing anneal required immediately after deposition. In this embodiment the flow step is delayed until after contact openings through the BPSG are formed. Then an oxidizing environment, such as oxygen or steam is used in an anneal step, converting the $P_2O_3$ to $P_2O_5$ which flows, and reshapes contact openings so they have more sloping sidewalls.

In addition means are provided to control the wall angle of a BPSG film by controlling the $P_2O_3/P_2O_5$ ratio in the film.

BRIEF DESCRIPTION OF THE DRAWINGS

The foregoing and other objects, features, and advantages of the invention will be apparent from the following detailed description of the invention, as illustrated in the accompanying drawings, in which:

FIG. 2 is a table showing the $P_2O_3/P_2O_5$ ratio as a function of process variables;

DETAILED DESCRIPTION OF THE INVENTION

Figure 1A:
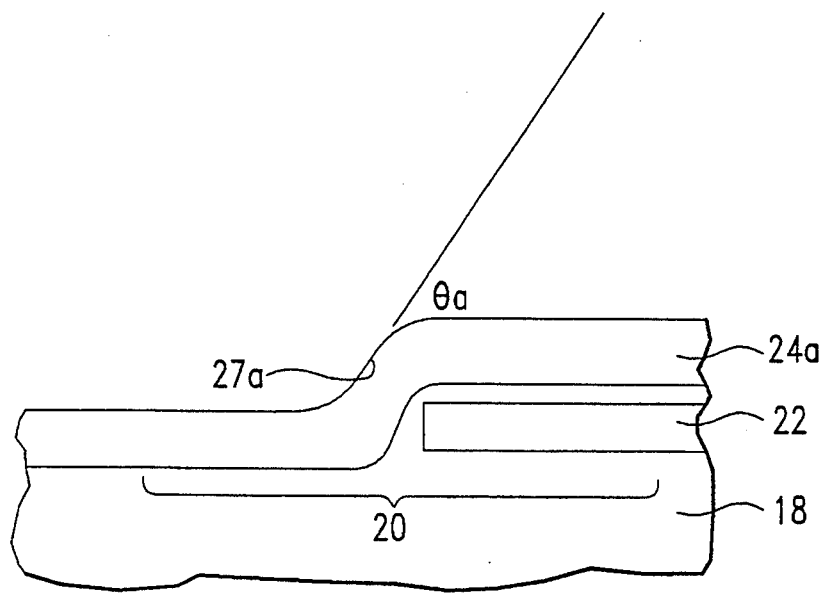
FIG. 1a is a cross-sectional view of a BPSG covered step that has not flowed.
Figure 1B:
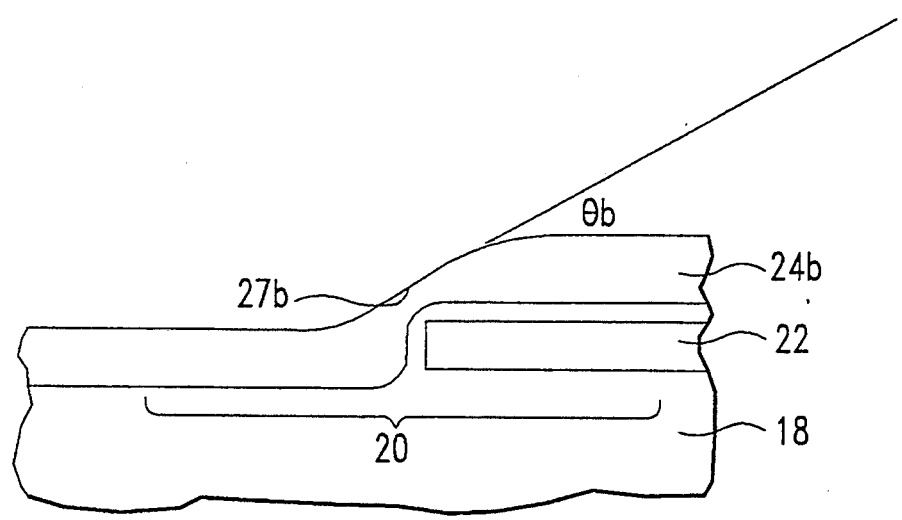
FIG. 1b is a cross-sectional view of a BPSG covered step that has flowed.

FIGS. 1a-1b illustrate a semiconducting wafer 18, typically formed from a material such as silicon, on which is formed an integrated circuit array, one cell 20 of which is shown. In the course of processing wafer 18, sharp steps 22 are formed for structures such as gates and other conducting lines. A BPSG film 24a is deposited, usually with a thickness in the range 2000 to 10,000Å. More preferably, the film thickness is in the range of about 4000 to 8000Å. Most preferably, about 5300Å. As-deposited BPSG film 24a is then annealed to smooth contours over step 22 and provide a 1.5 protective layer for the integrated circuit. The result is BPSG film 24b shown in FIG. 1b. The surface of flowed BPSG layer 24b need not be flat; flow is satisfactory if it reduces the wall angle $\Theta_b$ of contour 27b crossing step 22 compared to the wall angle $\Theta_a$ of contour 27a associated with as deposited BPSG film 24a. Typically, as deposited BPSG layer 24a has wall angle $\Theta_a$ in the range of 50° to 60° and flowed BPSG layer 24b has wall angle $\Theta_b$ in the range of 25° to 40°.

As noted hereinabove, PECVD was found to have a distinct disadvantage compared to APCVD. With PECVD deposition, the BPSG required a 70° higher flow temperature to achieve comparable contours when the anneal was conducted in a non-oxidizing environment, such as dry nitrogen than when conducted in a steam environment.

However, it was found that smoothing of contours on the surface at lower temperature is achieved by conducting the anneal in an oxidizing environment such as oxygen or steam. But an oxygen environment during the high temperature anneal introduces another problem, namely increased silicide and source-drain resistivity, a problem that decreases the speed of the integrated circuit device.

The increased resistivity arises because boron-doped silicon located in the source and drain regions of transistors is oxidized when oxygen diffuses through the BPSG to the silicon surface. Boron preferentially segregates into the silicon oxide, leaving less boron in the silicon to provide mobile carriers. While a silicon nitride layer formed before the BPSG deposition could be used to prevent the silicon oxidation and thereby avoid the boron segregation, the addition of a nitride layer would add to cost and process complexity.

It is known in the art that two oxidation states are present for the phosphorous in APCVD BPSG films, a $P_2O_3$ state and a more oxidized $P_2O_5$ state. However, it is believed that the prior art has neither taught nor suggested that BPSG film flow properties depend on the ratio of these two oxidation states. And the prior art, as illustrated in Research and Development Note 90-1, "Characteristics of BPSG Films from TEOS Deposited at 500° C." published By Watkins-Johnson Company, March 1990, p. 16, teaches against the finding of the present invention that a portion of $P_2O_3$ is needed for stabilizing the film.

In particular, the present inventors have determined that increasing the proportion of $P_2O_3$ to $P_2O_5$ in the composition inhibits glass flow in a non-oxidizing environment and raises the flow temperature. The present inventors believe that when a film with a large amount of $P_2O_5$ is annealed in an oxidizing environment, the satisfactory low temperature flow results are accounted for by the fact that some of the $P_2O_3$ is first further oxidized to $P_2O_5$. In addition, it has been determined by the present inventors that if the proportion of $P_2O_3$ to $P_2O_5$ is below about 2%, the BPSG film is unstable and a large number of crystalline particulates are formed. Thus, to achieve reduced flow temperature, a proportion of $P_2O_3/P_2O_5$ in the range of 0 to 25% is preferred. However, to enhance film stability, it is preferred that the ratio of $P_2O_3/P_2O_5$ be at least 2%. Thus, for a given boron composition, the conditions providing a reduced flow temperature while retaining film stability are those that provide a $P_2O_3/P_2O_5$ ratio of no lower than about 2% and no higher than about 25%.

It is known in the art that wall angle $\Theta_b$ illustrated in FIG. 1b can be controlled by controlling the anneal temperature. The present inventors have determined that for a given anneal temperature, wall angle $\Theta_b$ can be controlled by controlling the ratio of $P_2O_3/P_2O_5$ by methods described hereinbelow.

Various sources of the silicon, oxygen, phosphorous, and boron are known in the art. Sources of silicon include silane and tetraethylorthosilicate (TEOS). Sources of oxygen include nitrous oxide and oxygen. Sources of phosphorous include phosphene, trimethylphosphate (TMP), and triethylphosphate (TEP), Sources of boron include diborane and trimethylborate (TMB).

FIG. 2 sets forth experimental data showing the effect of three process variables, $N_2O$ flow, $SiH_4$ flow, and system pressure, on the ratio of $P_2O_3/P_2O_5$ in BPSG layers deposited with a Novellus PECVD tool. Also shown is the effect of these parameters on film thickness and the amount of boron and phosphorous incorporated in the film. In this tool wafers pass through a load lock into a reaction chamber on a heated block that serves as the bottom electrode of a pair of parallel plates. The top electrode includes a showerhead through which the premixed reactants pass. For this experiment diborane was diluted with nitrogen in a 10:1 ratio and the mixture flowed at 450 ccpm. Phosphene had the same dilution and flowed at 200 ccpm. The silane flow shown in Table 1 is before a 5:1 dilution with nitrogen. Nitrous oxide was not diluted. Temperature was fixed at 400° C. and the electrodes were connected to a 13.56 MHz power supply that was set at 1000 Watts to form the plasma in the gas mixture. In each case the reaction proceeded for 1 minute. Boron and phosphorus weight percent were measured using Inductively Coupled Argon Plasma Optical Emission Spectroscopy (ICAP). BPSG thickness and range were measured with a spectrophotometer. Ion chromatography was used to measure the percent $P_2O_3/P_2O_5$.

Figure 3A:
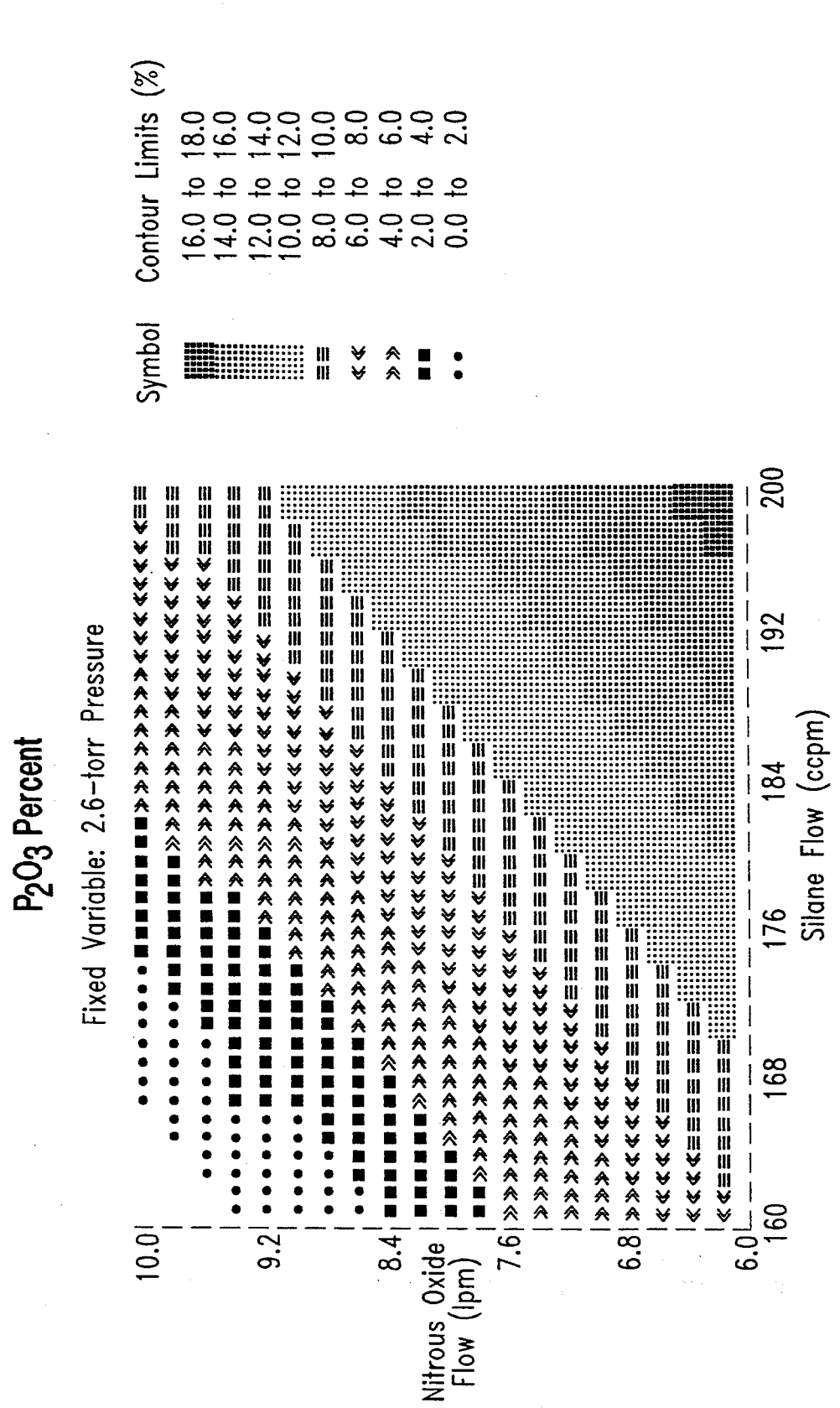
FIGS. 3a, 3b and 3c are contour plots showing the $P_2O_3/P_2O_5$ ratio as a function of process variables.
Figure 3B:
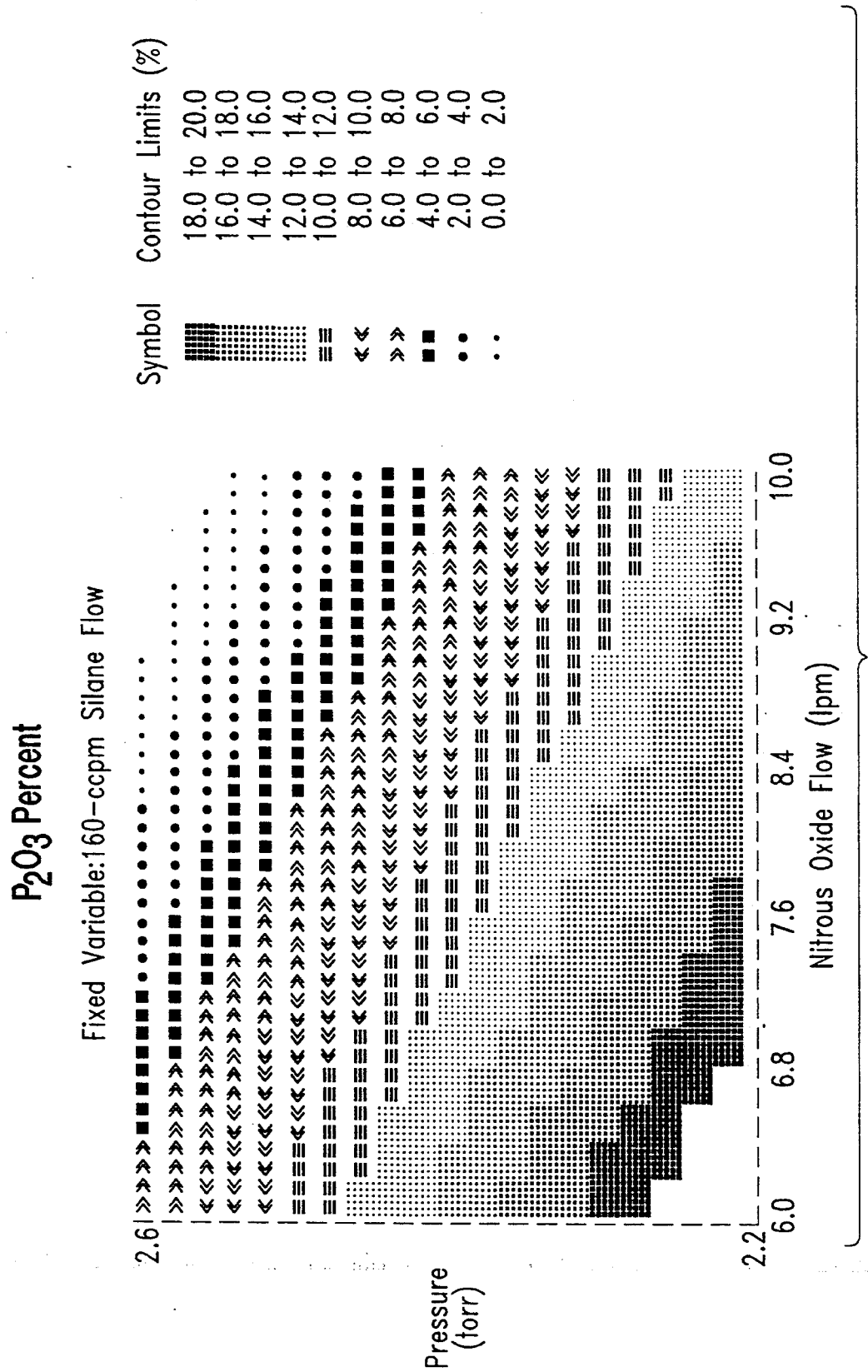
Figure 3C:
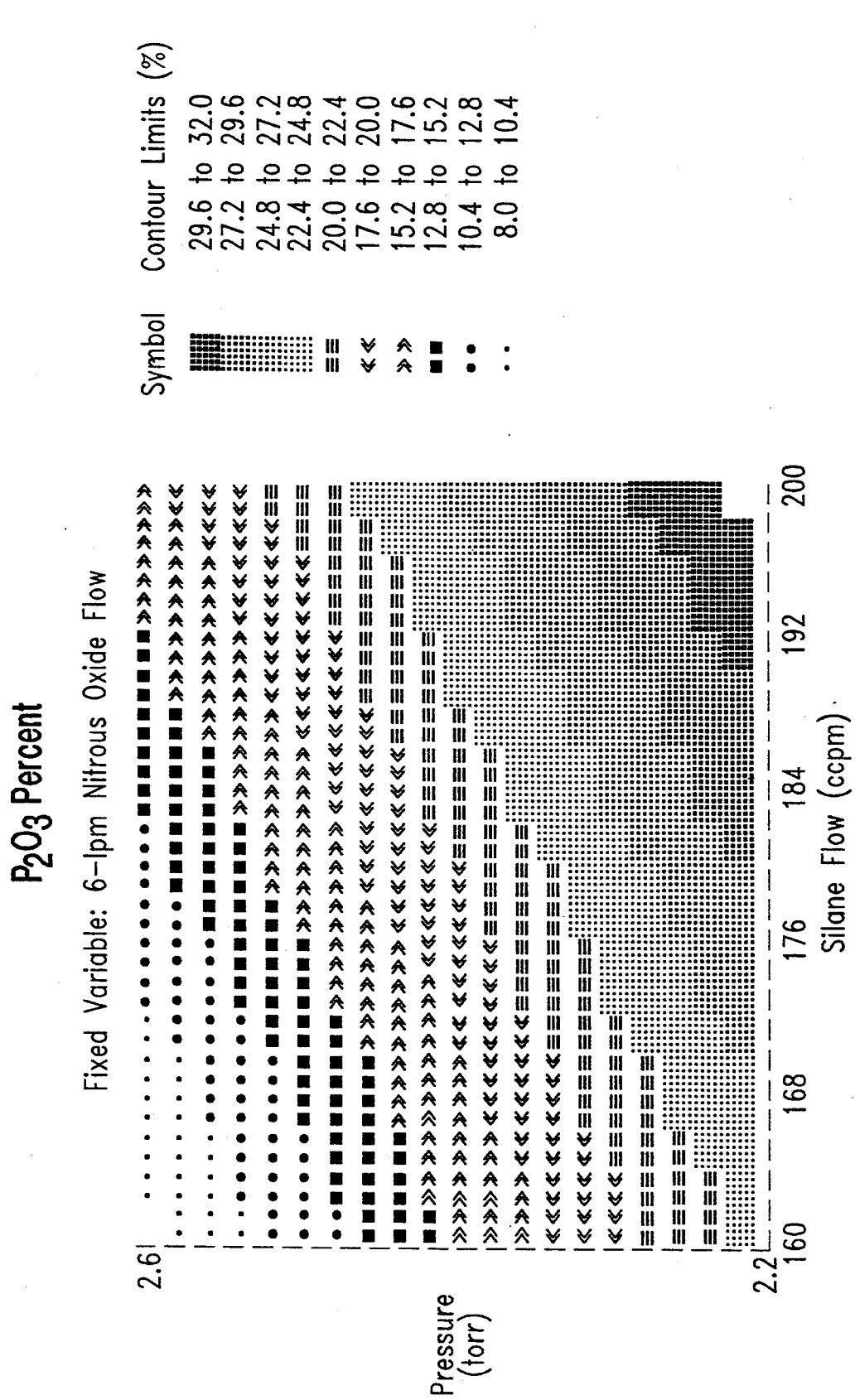

Experimental results indicate that the $P_2O_3/P_2O_5$ ratio is reduced when chamber pressure is increased, silane flow is lowered, or nitrous oxide flow is raised. As illustrated in FIGS. 3a–3c, various combinations of the three process variables can be used to achieve the same $P_2O_3/P_2O_5$ ratio. In FIG. 3, the amount of incompletely oxidized $P_2O_3$ is contour plotted as a function of input variables. Preferred system pressure is in the range of 0.8 to 10 torr, the 2.2 to 2.6 torr range is more preferred, and 2.4 to 2.6 torr most preferred. Preferred silane flow is in the range of 20 to 500 ccpm, the 160 to 200 ccpm range is more preferred, and about 140 to 160 ccpm is most preferred. Preferred nitrous oxide flow is in the range of 3 to 10 lpm, the 6 to 10 lpm range is more preferred, and 8 to 10 lpm is most preferred. Preferred deposition temperature is in the range of about 250° to about 500° C., more preferably about 400° C. Preferred system power is in the range of about 500 to about 1500 Watts, more preferably about 1000 Watts.

Figure 4A:
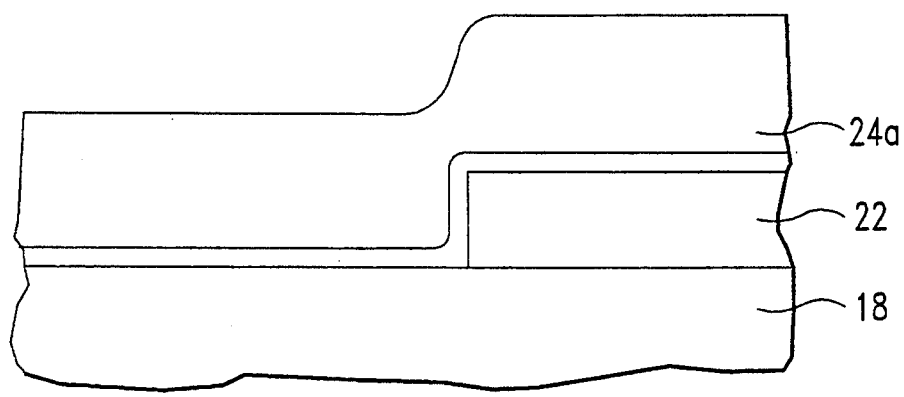
FIGS. 4a, 4b and 4c are cross-sectional views showing the process steps for forming a contact with more sloping sidewalls.
Figure 4B:
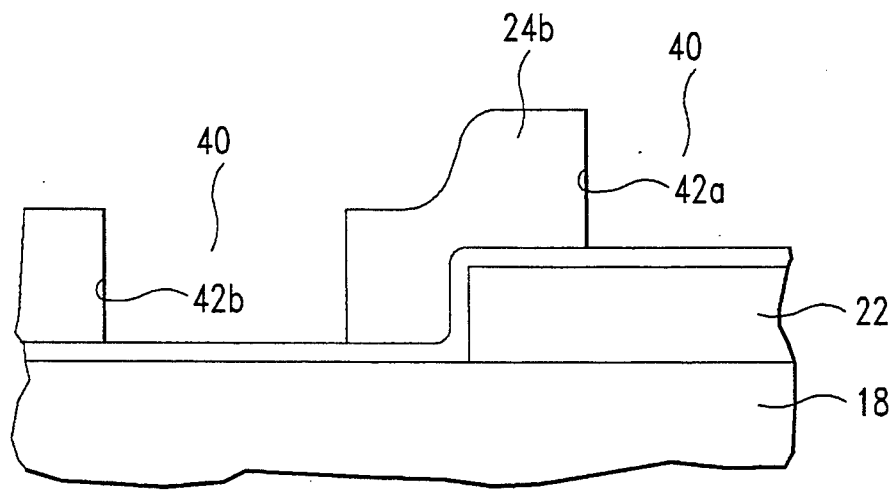
Figure 4C:
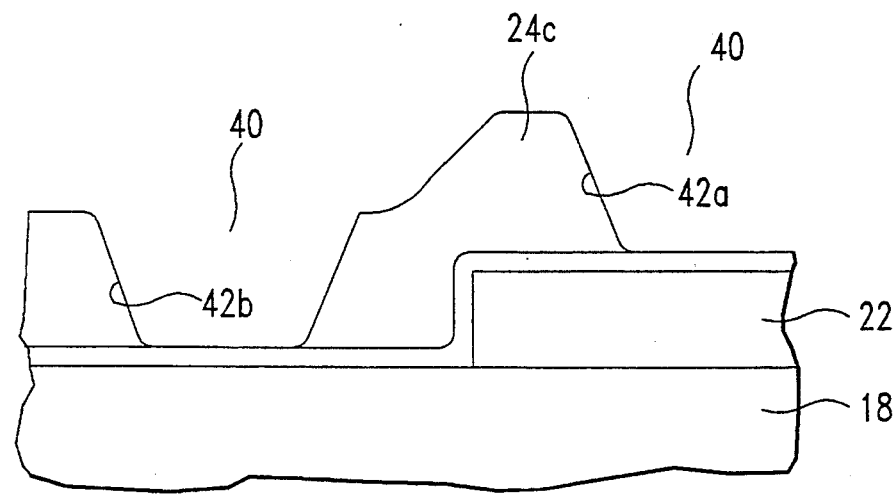

An embodiment of the invention further utilizing the ability to control flow temperature and flow angle by controlling the $P_2O_3/P_2O_5$ ratio is illustrated in FIGS. 4a–4c.

This embodiment provides sloping sidewalls in contact holes without the need for wet etch or complex dry etch processing. The sloping sidewalls are necessary to maintain metal thickness uniformity when deposited into contact vias.

As the first step in the process, illustrated in FIG. 4a, BPSG layer 24a is deposited using PECVD with a high $P_2O_3/P_2O_5$ ratio, e.g., about 20%, by method described herein-above and annealed at 900° C. in a dry nitrogen environment, which anneal does not substantially flow BPSG layer 24a. Then, as illustrated in FIG. 4b, contact openings 40 are formed in BPSG layer 24a by photolithographic and reactive ion etch process known in the art, producing substantially perpendicular sidewalls 42a. Finally, as illustrated in FIG. 4c, wafer 18 is annealed in an oxygen environment, and the BPSG film flows to form BPSG layer 24c with more sloping sidewalls 42b in contact openings 40.

While several embodiments of the invention, together with modifications thereof, have been described in detail herein and illustrated in the accompanying drawings, it will be evident that various further modifications are possible without departing from the scope of the invention. The examples given are intended only to be illustrative rather than exclusive and nothing in the above specification is intended to limit the invention more narrowly than the appended claims.

What is claimed is:

1. A method of forming a borophosphosilicate glass film, comprising the steps of
   providing gaseous boron, phosphorous, silicon, and oxygen-containing reactants in a chamber;
   controlling pressure and flow rates of said reactants and deposition temperature and depositing $P_2O_3$ and $P_2O_5$ in the film;
   controlling said depositing step to achieve a ratio of $P_2O_3$ to $P_2O_5$, said ratio a number selected from 2% to 25% by weight;
   annealing in a non-oxidizing environment at an annealing temperature, said anneal resulting in a wall angle;
   wherein said selected ratio determines said wall angle.

2. A method as recited in claim 1, further comprising, after said providing step, the step of forming a plasma comprising at least one of said reactants.

3. A method as recited in claim 1, wherein said selected ratio is from 2% to 10%.

4. A method as recited in claim 1, Wherein said reactants include at least one from the group silane, nitrous oxide, phosphene, and diborane.

5. A method as recited in claim 1, further comprising, after said providing step, the step of forming a plasma comprising at least one of said reactants, wherein said selected ratio is 2% to 10%, and wherein said reactants include at least one from the group silane, nitrous oxide, phosphene, and diborane.

6. A method as recited in claim 1, wherein said deposition temperature is about 250° C. to 500° C.

7. A method as recited in claim 1, wherein said pressure is about 2.0 torr to 2.8 torr.

8. A method as recited in claim 4, wherein the flow rate of undiluted silane is about 20 to 500 ccpm.

9. A method as recited in claim 4, wherein the flow rate of nitrous oxide is about 3 lpm to 10 lpm.

10. A method of forming a borophosphosilicate glass film, comprising the steps of:
    providing gaseous boron, phosphorous, silicon, and oxygen-containing reactants in a chamber;
    controlling pressure and flow rates of said reactants and deposition temperature and depositing $P_2O_3$ and $P_2O_5$ in the film;
    controlling said depositing step to achieve a $P_2O_3$ to $P_2O_5$ ratio selected to be at least 2% by weight;
    providing a first annealing step in a non-oxidizing environment wherein said selected ratio is sufficiently high so said first annealing step anneals the film without substantially altering wall angle;
    forming a pattern with openings in the film; and
    providing a second annealing step in an oxidizing environment so as to substantially reduce said wall angle.

11. A method as recited in claim 10, further comprising, after said providing step, the step of forming a plasma comprising at least one of said reactants.

12. A method as recited in claim 10, wherein said forming step comprises photolithography and reactive ion etching and said openings are contact openings.

13. A method as recited in claim 10, wherein said selected ratio is at least 10%.

14. A method as recited in claim 10, wherein said reactants include at least one from the group silane, nitrous oxide, phosphene, and diborane.

15. A method as recited in claim 10, further comprising, after said providing step, the step of forming a plasma comprising at least one of said reactants, wherein said forming step comprises photolithography and reactive ion etching and said openings are contact openings, and wherein said selected ratio is at least 10%, and wherein said reactants include at least one from the group silane, nitrous oxide, phosphene, and diborane.

16. A method as recited in claim 10, wherein said deposition temperature is about 250° C. to 500° C.

17. A method as recited in claim 10, wherein said pressure is about 2.0 torr to 2.8 torr.

18. A method as recited in claim 14, wherein the flow rate of undiluted silane is about 20 to 500 ccpm.

19. A method as recited in claim 14, wherein the flow rate of nitrous oxide is about 3 lpm to 10 lpm.

* * * * *